(12) United States Patent
Pramanik

(10) Patent No.: US 7,413,815 B2
(45) Date of Patent: Aug. 19, 2008

(54) THIN LAMINATE AS EMBEDDED CAPACITANCE MATERIAL IN PRINTED CIRCUIT BOARDS

(75) Inventor: Pranabes K. Pramanik, Clifton Park, NY (US)

(73) Assignee: Oak-Mitsui Inc., Hoosick Falls, NY (US)

( * ) Notice: Subject to any disclaimer, the term of this patent is extended or adjusted under 35 U.S.C. 154(b) by 840 days.

(21) Appl. No.: 10/782,130

(22) Filed: Feb. 19, 2004

(65) Prior Publication Data

US 2005/0186437 A1   Aug. 25, 2005

(51) Int. Cl.
*B21D 39/00* (2006.01)
*B32B 15/08* (2006.01)
*B32B 27/00* (2006.01)

(52) U.S. Cl. .................. 428/621; 428/623; 428/626; 428/416; 428/425.8; 428/458; 428/460; 428/461

(58) Field of Classification Search ................ 428/615, 428/621, 623–626, 416, 425.8, 458, 460, 428/461

See application file for complete search history.

(56) References Cited

U.S. PATENT DOCUMENTS

| | | | | |
|---|---|---|---|---|
| 4,677,017 | A | 6/1987 | DeAntonis et al. | 428/214 |
| 4,826,955 | A | 5/1989 | Akkapeddi et al. | 528/324 |
| 5,003,037 | A * | 3/1991 | Fenoglio et al. | 528/350 |
| 5,139,878 | A | 8/1992 | Kim et al. | 428/421 |
| 5,155,655 | A | 10/1992 | Howard et al. | 361/303 |
| 5,161,086 | A | 11/1992 | Howard et al. | 361/321 |
| 5,439,541 | A | 8/1995 | Economy | 156/182 |
| 5,541,267 | A | 7/1996 | Akkapeddi et al. | 525/432 |
| 5,679,230 | A | 10/1997 | Fatcheric et al. | 205/50 |
| 5,707,782 | A | 1/1998 | Economy et al. | 430/285.1 |
| 2001/0005304 | A1 * | 6/2001 | Appelt et al. | 361/312 |

* cited by examiner

*Primary Examiner*—Kevin R. Kruer
(74) *Attorney, Agent, or Firm*—Roberts & Roberts, LLP

(57) ABSTRACT

The invention concerns multilayered structures useful for forming capacitors, which may be embedded within printed circuit boards or other microelectronic devices. The multilayered structure comprises a pair of parallel electrically conductive layers separated by a pair of dielectric layers and a central polymerizable layer. Each of the dielectric layers and the central layer may include a filler. Capacitors formed from the multilayered structures of the invention exhibit excellent short circuit resistance as well as excellent void resistance.

8 Claims, 1 Drawing Sheet

THIN LAMINATE AS EMBEDDED CAPACITANCE MATERIAL IN PRINTED CIRCUIT BOARDS

BACKGROUND OF THE INVENTION

1. Field of the Invention

This invention relates to structures suitable for forming capacitors. More particularly, this invention pertains to capacitors embedded within printed circuit boards or other microelectronic devices. The capacitor comprises a pair of parallel electrically conductive foils separated by a pair of coatings of a thermosetting polymer and a central polymerizable layer, each of which preferably contain a filler material. The capacitor exhibits excellent capacitance density and short circuit resistance.

2. Description of the Related Art

A capacitor is a device used for introducing capacitance into a circuit, and functions primarily to store electrical energy, block the flow of direct current, or permit the flow of alternating current. They generally comprise a dielectric material sandwiched between two electrically conductive metal layers, such as copper foils. Such dielectric materials may be coupled to the electrically conductive metal layers via an adhesive layer, by lamination, by coating or by other forms of deposition, e.g. vapor deposition. U.S. Pat. No. 5,155,655 describes one method for forming a capacitor wherein a single sheet of a dielectric material is laminated together with two conductive foils. To optimize the performance of a capacitor, it is important that the dielectric material employed has good material properties exhibiting qualities such as superior adhesion, high dielectric strength and good flexibility.

Capacitors are common elements on printed circuit boards and other microelectronic devices. The capacitor is electrically connected either as a discrete element on the circuit board or may be embedded within the circuit board. Of these options, it has been preferred to form printed circuit boards having embedded capacitors to maximize the surface area of the circuit board for other purposes. The capacitance of a capacitor depends primarily on the shape and size of the capacitor layers and the dielectric constant of the insulating material. There are various known types of dielectric materials known in the art. For example, the dielectric material may be a gas, such as air, a vacuum, a liquid, a solid or a combination thereof. Each material has its own particular properties.

In forming capacitors for use in printed circuit boards, a dielectric material such as a glass reinforced polymer matrix has been used. However, the performance of capacitors of this type has been limited by factors such as the limited minimum thickness of the dielectric material, which detracts from the flexibility of the capacitor and attainable capacitance, the effect of bond enhancers on the metal foils, low dielectric constant and poor dielectric strength. It is desirable to form a capacitor for a circuit board having a high dielectric constant and extremely thin layer or layers of dielectric material, thus increasing the capacitance and flexibility of the capacitor. However, a common problem frequently associated with such extremely thin dielectric layers is the formation of microscopic voids or other structural defects in the layer. For example, U.S. Pat. No. 5,161,086 provides a capacitor laminate having a single thin sheet of a dielectric material between two sheets of conductive foil. Dielectric layers of this type are highly vulnerable to the formation of voids and are time consuming to detect and remedy.

The present invention provides a capacitor that solves the problems of the prior art. The present invention provides capacitors that comprise a pair of parallel electrically conductive foils separated by a pair of coatings of a thermosetting polymer material, each preferably comprising an epoxy, and a central polymerizable layer. Each of the thermosetting layers and the central polymerizable layer preferably contains a filler material. In forming the capacitors of the invention, a liquid epoxy material is coated onto a surface of each of the conductive foils, followed by coating a central polymerizable layer in liquid form onto at least one of the epoxy coatings. The two coated conductive foils are then laminated together and the central layer is polymerized in-situ. The result is a multilayered structure having excellent properties such as high capacitance density, exceptional integrity and short circuit resistance. By incorporating a filler into at least one of these dielectric layers, the capacitance density of the capacitor may be controlled. Also, thin dielectric layers allow for greater heat conductivity and greater flexibility of the capacitor. The epoxy coatings and the central polymerizable layer further exhibit high resistance to thermal stress and low moisture absorption. Together, these factors offer a significant improvement in performance and cost over prior art capacitors and printed circuit boards.

SUMMARY OF THE INVENTION

The invention provides a multilayered construction suitable for forming capacitors which is formed by a process which comprises:

a) applying a first thermosetting polymer layer onto a surface of a first electrically conductive layer;

b) applying a central polymerizable layer onto the first thermosetting polymer layer;

c) applying a second thermosetting polymer layer onto a surface of a second electrically conductive layer; thereafter d) attaching the first electrically conductive layer to the second electrically conductive layer such that each of the first and second thermosetting polymer layers and the central polymerizable layer are positioned between the first and second electrically conductive layers; and thereafter e) polymerizing said polymerizable layer;

wherein each of said first thermosetting polymer layer, said second thermosetting polymer layer and said central polymerizable layer optionally further comprises a filler material. The invention also provides a process for forming a multilayered construction suitable for forming capacitors which comprises:

a) applying a first thermosetting polymer layer onto a surface of a first electrically conductive layer;

b) applying a central polymerizable layer onto the first thermosetting polymer layer;

c) applying a second thermosetting polymer layer onto a surface of a second electrically conductive layer; thereafter d) attaching the first electrically conductive layer to the second electrically conductive layer such that each of the first and second thermosetting polymer layers and the central polymerizable layer are positioned between the first and second electrically conductive layers; and thereafter e) polymerizing said polymerizable layer;

wherein each of said first thermosetting polymer layer, said second thermosetting polymer layer and said central polymerizable layer optionally further comprises a filler material.

The invention further provides a multilayered construction suitable for forming capacitors which comprises:

a) a first electrically conductive layer, having first and second surfaces;

b) a first thermosetting polymer layer, having first and second surfaces, on the first electrically conductive layer with the first surface of the first thermosetting polymer layer on the second surface of the first electrically conductive layer;

c) a central polymerizable layer, having first and second surfaces, on the first thermosetting polymer layer with the first surface of the central polymerizable layer on the second surface of the first thermosetting polymer layer;

d) a second thermosetting polymer layer, having first and second surfaces, on the central polymerizable layer with the first surface of the second thermosetting polymer layer on the second surface of the second surface of the central polymerizable layer; and e) a second electrically conductive layer, having first and second surfaces, on the second thermosetting polymer layer with the first surface of the second electrically conductive layer on the second surface of the second thermosetting polymer layer;

wherein each of said first thermosetting polymer layer, said second thermosetting polymer layer and said central polymerizable layer optionally further comprises a filler material.

DETAILED DESCRIPTION OF THE PREFERRED EMBODIMENTS

Figure 1:
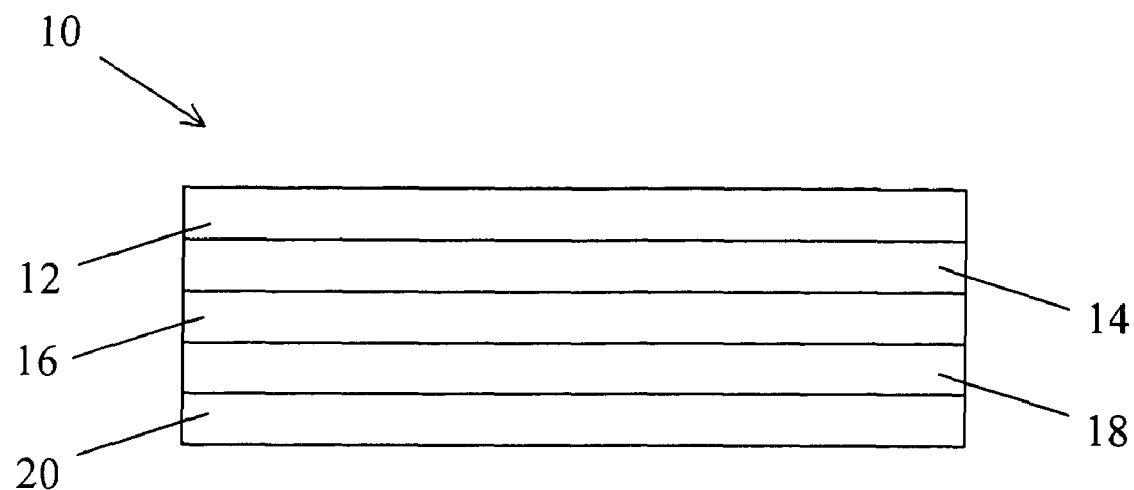
FIG. 1 is a side-view schematic representation of a multilayered construction of the invention.
Figure 2:
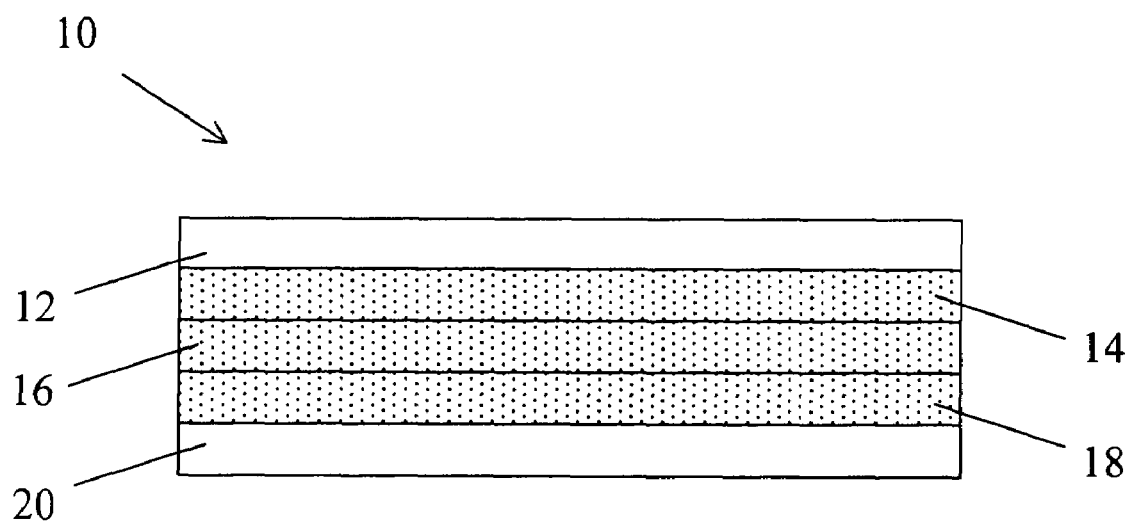
FIG. 2 is a side-view schematic representation of a multilayered construction of the invention in which each of the layers between the conductive foils include a filler.

The invention provides a multilayered construction suitable for forming capacitors. As shown in FIG. 1, the multilayered construction 10 comprises sequentially attached layers comprising a first electrically conductive layer or foil 12, a first thermosetting polymer layer 14 on a surface of the conductive layer 12, a central polymerizable layer 16 on a second surface of the first thermosetting polymer layer 14, a second thermosetting polymer layer 18 on a second surface of the central polymerizable layer 16 and a second electrically conductive layer or foil 20 on a second surface of the second thermosetting polymer layer 18. By sequentially attached it is meant that the layers must be present in the indicated order. The first and second thermosetting polymer layers 14 and 18 may be the same or a different material, and the first and second electrically conductive layers or foils 12 and 20 may be the same or a different material. In a preferred embodiment, the multilayered construction 10 is a capacitor.

In the preferred method of producing the multilayered construction, the first thermosetting polymer layer 14 is first applied to the first surface of a first electrically conductive layer 12 and the second thermosetting polymer layer 18 is applied to the first surface of a second electrically conductive layer 20. Next, the central polymerizable layer 16 is applied to either the first thermosetting polymer layer 14 or the second thermosetting polymer layer 18 or both. Subsequently, the first electrically conductive layer 12 and the second electrically conductive layer 20 are attached such that each of the first and second thermosetting polymer layers and the central polymerizable layer are positioned between the first and second electrically conductive layers. For the purposes of this invention, it is not critical should the central polymerizable layer be applied only to the first thermosetting polymer layer 14 or the second thermosetting polymer layer 18. Additionally, the order in which said thermosetting polymer layers are applied to their respective electrically conductive layers is not a critical feature of the invention.

For purposes of this invention, unless specified, applying or attaching means any well known method of appending one layer to the next layer, non-exclusively including coating, laminating, sputtering, vapor depositing, electrodeposition, plating, or evaporating, either simultaneously or sequentially. However, in the preferred embodiment of the invention, each of said first and second thermosetting polymer layers 14 and 18 are applied by coating onto their respective conductive layers in a liquid form. For example, said thermosetting polymer layers may be applied as a liquid in which the liquid comprises a thermosetting polymer and a solvent. Such coating may be done by unwinding web of conductive foil from a roll and then applying a continuous layer of the material onto a surface of the conductive foil. A metering device such as a doctor blade, slot-die, reverse roll or other may regulate the thickness of the dielectric layer. If the thermosetting polymers are prepared without a solvent, application techniques include vapor deposition or sputtering in the case the dielectric can be easily vaporized and re-condensed. In another technique, a self-standing thermosetting polymer layer or film may be adhered or laminated onto a surface of each conductive layer.

Preferred metal foils for the electrically conductive metal layers of the invention comprise copper, zinc, brass, chrome, nickel, aluminum, stainless steel, iron, gold, silver, titanium and combinations and alloys thereof. Examples of such conductive materials are disclosed in U.S. Pat. No. 5,679,230. Most preferably, each of the conductive layers 12 and 20 comprises a copper foil. The foil preferably has a thickness of from about 0.5 μm to about 200 μm, more preferably from about 1.5 μm to about 50 μm and most preferably from about 5 μm to about 10 μm.

Copper foils are preferably produced by electrodepositing copper from solution onto a rotating metal drum as is well known in the art. The side of the foil next to the drum is typically the smooth or shiny side, while the other side has a relatively rough surface, also known as the matte side. This drum is usually made of stainless steel or titanium which acts as a cathode and receives the copper as it is deposited from solution. An anode is generally constructed from a lead alloy. A cell voltage of about 5 to 10 volts is applied between the anode and the cathode to cause the copper to be deposited, while oxygen is evolved at the anode. This copper foil is then removed from the drum and cut to the required size.

The metal foil may optionally be roughened, such as by micro-etching, by being electrolytically treated on the shiny side to form a roughened copper deposit, and/or electrolytically treated on the matte side to deposit micro-nodules of a metal or metal alloy on or in the surface. These nodules are preferably copper or a copper alloy, and increase adhesion to the polymer film. The surface microstructure of the foil may be measured by a profilometer, such as a Perthometer model M4P or S5P which is commercially available from Mahr Feinpruef Corporation of Cincinnati, Ohio. Topography measurements of the surface grain structure of peaks and valleys are made according to industry standard IPC-TM-650 Section 2.2.17 of the Institute for Interconnecting and Packaging Circuits of 2115 Sanders Road, Northbrook, Ill. 60062.

In the measurement procedure, a sample measurement length lm over the surface is selected. An Rz is the determined, where Rz is defined as the average maximum peak to valley height of five consecutive sampling lengths within the measurement length lm. An Ra, or average roughness, is also determined where Ra is defined as the arithmetic average value of all absolute distances of the roughness profile from the center line within the measuring length lm. The surface treatments are carried out to produce a surface structure having peaks and valleys which produce roughness parameters wherein Ra ranges from about 1 to about 10 μm and Rz ranges from about 2 to about 10 μm.

The optional surface treatments on the shiny side of the foil are preferably carried out to produce a surface structure having peaks and valleys which produce roughness parameters wherein Ra ranges from about 1 to about 4 μm, preferably from about 2 to about 4 μm, and most preferably from about 3 to about 4 μm. The Rz value ranges from about 2 to about 4.5 μm, preferably from about 2.5 to about 4.5 μm, and more preferably from about 3 to about 4.5 μm.

The optional surface treatments on the matte side of the foil are preferably carried out to produce a surface structure having peaks and valleys which produce roughness parameters wherein Ra ranges from about 4 to about 10 μm, preferably from about 4.5 to about 8 μm, and most preferably from about 5 to about 7.5 μm. The Rz value ranges from about 4 to about 10 μm, preferably from about 4 to about 9 μm, and more preferably from about 4 to about 7.5 μm.

An optional copper deposit on the shiny side of the foil will preferably produce a copper deposit of about 2 to about 4.5 μm thick to produce an average roughness of 2 μm or greater. An optional nodule deposit on the matte side preferably will have a roughness Rz as made of about 4 to about 7.5 μm. The micro-nodules of metal or alloy will have a size of about 0.5 μm. Other metals may be deposited as micro nodules if desired, for example, zinc, indium, tin, cobalt, brass, bronze and the like. This process is more thoroughly described in U.S. Pat. No. 5,679,230. In the preferred embodiment of the invention, the shiny surface preferably has a peel strength ranging from about 0.7 kg/linear cm to about 1.6 kg/linear cm, more preferably from about 0.9 kg/linear cm to about 1.6 kg/linear cm. The matte surface preferably has a peel strength ranging from about 0.9 kg/linear cm to about 2 kg/linear cm, more preferably from about 1.1 kg/linear cm to about 2 kg/linear cm. Peel strength is measured according to industry standard IPC-TM-650 Section 2.4.8 Revision C.

In the case of foils prepared by electrodeposition, where one of the surfaces has a matte finish and the opposing side a shiny finish, the thermosetting polymer layers 14 and 18 may be applied onto either the shiny or matte surface of the foil. In the case where a stronger bond between a dielectric layer and the conductive foil is desired, the thermosetting polymer layers 14 and 18 are preferably applied to the matte side of the conductive layers 12 or 20. The conductive layers 12 and 20 can be mechanically or chemically treated to provide a more active surface to enhance the bond strength. In the case where a lower profile (less rough) surface is desired, the shiny surface of the conductive layer or foil can be used.

In the preferred multilayered construction of the invention, one or both of the first thermosetting polymer layer and the second thermosetting polymer layer independently comprise a material selected from the group consisting of an epoxy, a melamine, polyesters, polyester containing copolymers, a urethane, alkyd, a bis-maleimide triazine, a polyimide, an ester, polyarylene ethers, fluorinated polyarylene ethers, benzocyclobutenes, liquid crystal polymers, an allyated polyphenylene ethers, amines and combinations thereof. Most preferably, each of the first and second thermosetting polymer layers 14 and 18 comprise an epoxy. Other acceptable materials include aromatic thermosetting co-polyesters such as those described in U.S. Pat. Nos. 5,439,541 and 5,707,782. Of these materials, the most preferred dielectric is an epoxy having a glass transition temperature (Tg) of at least about 180° C.

The thermosetting polymer layers are preferably coated onto the electrically conductive layers 12 and 20 as liquid polymer solutions to allow for control and uniformity of the polymer thickness. The solution will typically have a viscosity ranging from about 50 to about 35,000 centipoise with a preferred viscosity in the range of 100 to 27,000 centipoise. The polymer solution will preferably include from about 10% to about 80% by weight and more preferably about 15% to 60% by weight of the polymer with the remaining portion of the solution comprising one or more solvents. Useful solvents include acetone, methyl-ethyl ketone, cyclopentanone, ethanol, N-methyl pyrrolidone, N, N dimethylformamide, N, N dimethylacetamide and mixtures thereof. A most preferred single solvent is methyl-ethyl ketone. The first and second thermosetting polymer layers 14 and 18 preferably form a substantially uniform layer on a complete surface of its corresponding first or second electrically conductive layer 12 or 20.

Each of the first thermosetting polymer layer 14 and the second thermosetting polymer layer 18 preferably have a dielectric constant of from about 3 to about 65. Each of the thermosetting polymer layers preferably have a glass transition temperature (Tg) of at least about 180° C. Additionally, each of said first and second thermosetting polymer layer preferably have a preferred thickness of from about 0.5 μm to about 100 μm, more preferably 1 μm to about 15 μm and most preferably from about 1.5 μm to about 10 μm.

In the preferred embodiment of the invention, the central polymerizable layer 16 is applied to at least one of said thermosetting polymer layers subsequent to the application of the thermosetting polymer layers to their respective electrically conductive layers. Alternately, the central polymerizable layer 16 may be applied to either or both of the thermosetting polymer layers prior to the application of said thermosetting polymer layers to their respective electrically conductive layers. In the preferred embodiment of the invention, the central polymerizable layer 16 is applied as an polymerizable or unpolymerized monomer or oligomer and is then polymerized in-situ after said first and second conductive layers are combined. It has been unexpectedly found that this allows for the formation of capacitors having improved performance, including excellent short-resistance and excellent void-resistance. Accordingly, the central polymerizable layer preferably comprises a polymerizable precursor of a polyethylene terephthalate, a polyethylene naphthalate, a polyvinyl carbazole, a polyphenylene sulfide, a polyamide, a polyimide, a polyamide-polyimide, a polyether-nitrile, a polyether-ether-ketone or combinations thereof. Suitable monomeric or oligomeric precursors are those which are commonly known in the art. Once the multilayered construction of the invention is formed, the central polymerizable layer is polymerized in-situ yielding an at least partially polymerized layer of a polyethylene terephthalate, a polyethylene naphthalate, a polyvinyl carbazole, a polyphenylene sulfide, a polyamide, a polyimide, a polyamide-polyimide, a polyether-nitrile, a polyether-ether-ketone or a combination thereof. Of these, the most preferred are precursors which after polymerization form at least one polyamide, at least one polyimide or a combination of at least one polyamide and at least one polyimide.

Suitable polyamides, or nylons, within the scope of the invention non-exclusively include homopolymers or copolymers selected from aliphatic polyamides and aliphatic/aromatic polyamides having a molecular weight of from about 10,000 to about 100,000. Useful polyamide homopolymers include poly(4-aminobutyric acid) (nylon 4), poly(6-aminohexanoic acid) (nylon 6, also known as poly(caprolactam)), poly(7-aminoheptanoic acid) (nylon 7), poly(8-aminooctanoic acid)(nylon 8), poly(9-aminononanoic acid) (nylon 9), poly(10-aminodecanoic acid) (nylon 10), poly(11-aminoundecanoic acid) (nylon 11), poly(12-aminododecanoic acid) (nylon 12), nylon 4,6, poly(hexamethylene adipamide) (nylon 6,6), poly(hexamethylene sebacamide) (nylon 6,10), poly(heptamethylene pimelamide) (nylon 7,7), poly(octamethylene suberamide) (nylon 8,8), poly(hexamethylene azelamide) (nylon 6,9), poly(nonamethylene azelamide) (nylon 9,9), poly(decamethylene azelamide) (nylon 10,9), poly(tetramethylenediamine-co-oxalic acid) (nylon 4,2), the polyamide of n-dodecanedioic acid and hexamethylenediamine (nylon 6,12), the polyamide of dodecamethylenediamine and n-dodecanedioic acid (nylon 12,12) and the like. Useful aliphatic polyamide copolymers include caprolactam/hexamethylene adipamide copolymer (nylon 6,6/6), hexamethylene adipamide/caprolactam copolymer (nylon 6/6,6), trimethylene adipamide/hexamethylene azelaiamide copolymer (nylon trimethyl 6,2/6,2), hexamethylene adipamide-hexamethylene-azelaiamide caprolactam copolymer (nylon 6,6/6,9/6) and the like. Also included are other nylons which are not particularly delineated here. Of these polyamides, preferred polyamides include nylon 6, nylon 6,6, nylon 6/6,6 as well as mixtures of the same. Of these, nylon 6 is most preferred.

Aliphatic polyamides suitable for the purposes of this invention are prepared in accordance with known preparatory techniques. Exemplary of aliphatic/aromatic polyamides include poly(tetramethylenediamine-co-isophthalic acid) (nylon 4,I), polyhexamethylene isophthalamide (nylon 6,I), hexamethylene adipamide/hexamethylene-isophthalamide (nylon 6,6/6I), hexamethylene adipamide/hexamethylene-terephthalamide (nylon 6,6/6T), poly (2,2,2-trimethyl hexamethylene terephthalamide), poly(m-xylylene adipamide) (MXD6), poly(p-xylylene adipamide), poly(hexamethylene terephthalamide), poly(dodecamethylene terephthalamide), polyamide 6T/6I, polyamide 6/MXDT/I, polyamide MXDI, and the like. Blends of two or more aliphatic/aromatic polyamides are also appropriate. Aliphatic/aromatic polyamides can be prepared by known preparative techniques. Other suitable polyamides are described in U.S. Pat. Nos. 4,826,955 and 5,541,267, which are incorporated herein by reference.

Alternately, the central polymerizable layer may be applied as an uncured polyimide or a mixture of uncured polyimides. For example, a solution may be formed of the polymer and an organic solvent. It is preferred that a single solvent be used in each polymer solution. Useful solvents include acetone, methyl-ethyl ketone, cyclopentanone, ethanol, N-methyl pyrrolidone, N, N dimethylformamide, N, N dimethylacetamide and mixtures thereof. The most preferred single solvent is methyl-ethyl ketone. The polymer-solvent solution will typically have a viscosity ranging from about 5,000 to about 35,000 centipoise with a preferred viscosity in the range of 15,000 to 27,000 centipoise. The solution may comprise from about 10% by weight to about 60% by weight of polymer, more preferably from about 15% by weight to about 30% by weight of polymer with the remaining portion of the solution comprising one or more solvents. The central polymerizable layer 16 preferably forms a substantially uniform layer on either the first thermosetting polymer layer 14 or the second thermosetting polymer layer 18 or both. After application, the solvent is preferably evaporated leaving a polymeric film on the metal layer.

Polyimides are a preferred polymer for the polymerized central layer because they have high electrical strengths, good insulating properties, a high softening point and are inert to many chemicals. Preferred polyimides will have a glass transition temperature of from about 160° C. to about 320° C., with a more preferable Tg of from about 190° C. to about 270° C. The preferred polyimide is applied to the first and/or second thermosetting polymer layer as a solution to control the polymer thickness and uniformity. Also preferred is a combination of at least one polyamide and at least one polyimide which, as discussed above, are applied in their polymerizable or unpolymerized state and are subsequently polymerized in-situ after the formation of said multilayered construction. In the preferred embodiment of the invention, the central polymerizable layer preferably has a dielectric constant of from about 3 to about 65. The central polymerizable layer also preferably has a thickness of from about 1 µm to about 30 µm, more preferably from about 5 µm to about 20 µm. In the most preferred embodiment of the invention, the central polymerizable layer has a Tg of at least about 220° C.

The thermosetting polymer layers 14 and 18 and the central polymerizable layer 16 also preferably comprise a filler material. Preferred fillers non-exclusively include inorganic materials including powdered ferroelectric materials, barium titanate ($BaTiO_3$), boron nitride, aluminum oxide, strontium titanate, barium strontium titanate, quartz and other ceramic fillers and combinations thereof. The most preferred filler comprises barium titanate. If incorporated, a filler is preferably present in the thermosetting polymer layers in an amount of from about 1% to about 90% by weight of the layer, more preferably from about 5% to about 75% by weight of the layer. Preferably at least one of the first thermosetting polymer layer 14, the central polymerizable layer 16 and the second thermosetting polymer layer 18 comprises such a powdered filler having a dielectric constant of about 10 or higher. Most preferably, all three of said first thermosetting polymer layer 14, central polymerizable layer 16 and the second thermosetting polymer layer 18 further comprise such a filler. In addition, either one or both of the thermosetting polymer layers and the central polymerizable layer may contain a dye or pigment to impart color, alter dielectric opacity or affect contrast.

After attaching the individual layers, the multilayered construction may optionally be placed into an oven to evaporate residual solvent(s) from the thermosetting polymer layers and/or central polymerizable layer and either partially or fully cure the layers. Such procedure may be done by subjecting the multilayered construction to a temperature of from about 38° C. (100° F.) to about 316° C. (600 ° F.), for about 1 to about 120 minutes. The thermosetting polymer layers and/or central polymerizable layer may be fully or partially cured depending on the manufacturing process of the capacitor. After the desired degree of cure is completed, the multilayered construction is removed from the oven and cooled. Alternately, the thermosetting polymer layers 14 and 18 may be at least partially cured either prior to the application of said central polymerizable layer or prior to their application to their respective electrically conductive layers.

In an alternate embodiment, the thermosetting polymer layers 14 and 18 may be applied to the conductive foils in the form of solid sheets. In such an embodiment, a first solid thermosetting polymer layer may be laminated onto a surface of a first conductive foil and a second solid thermosetting polymer layer is then laminated onto a second conductive foil. Lamination may be conducted in a press at a temperature of from about 150° C. to about 310° C., more preferably from about 160° C. to about 200° C. Lamination may be conducted for from about 30 minute to about 120 minutes, preferably from about 40 minutes to about 80 minutes. Preferably, the press is under a vacuum of at least 70 cm (28 inches) of mercury, and maintained at a pressure of about from about 3.5 kgf/cm$^2$ (50 psi) to about 28 kgf/cm$^2$ (400 psi), preferably from about 4.9 kgf/cm$^2$ (70 psi) to about 14 kgf/cm$^2$ (200 psi). The dry, solid thermosetting polymer layers may comprise about 100% of any of the above compounds or may comprise mixtures of these or may contain other additives.

In another alternate embodiment, the thermosetting polymer layers 14 and 18 may be extruded onto the first and second electrically conductive layers 12 and 20. For example, the thermosetting material for the individual layers are fed into infeed hoppers of a like number of extruders, each extruder handling the material for one or more of the layers at a temperature below the glass transition temperature of the material. The melted streams from the individual extruders are fed into a single manifold co-extrusion die. The layers then emerge from the die as a single layer of polymeric material. After exiting the die, the film may be cast onto a first controlled temperature casting roll, passed around the first roll, and then onto a second controlled temperature roll, which is normally cooler than the first roll. The controlled temperature rolls largely control the rate of cooling of the film after it exits the die. Additional rolls may be employed. In another method, the film forming apparatus may be one which is referred to in the art as a blown film apparatus and includes a multi-manifold circular die head for bubble blown film through which the plasticized film composition is forced and formed into a film bubble which may ultimately be collapsed and formed into a film. Processes of extrusion to form film and sheet laminates are generally known. Typical coextrusion techniques are described in U.S. Pat. Nos. 5,139,878 and 4,677,017.

Once the first thermosetting polymer layer 14 is applied to the first electrically conductive layer 12 and the second thermosetting polymer layer 18 is applied to the second electrically conductive layer 20, and after the central polymerizable layer is applied to either one or both of the thermosetting polymer layers, the first electrically conductive layer is laminated to the second electrically conductive layer such that each of the first and second thermosetting polymer layers and the central polymerizable layer are positioned between the first and second electrically conductive layers. This lamination step is conducted using the same lamination conditions as described above.

In the preferred embodiment of the invention, the multi-layered structure of the invention forms a capacitor. The preferred capacitance of the capacitor is at least about 100 pF/cm$^2$, more preferably from about 100 pF/cm$^2$ to about 4,000 pF/cm$^2$. The capacitors of this invention may be used in a variety of printed circuit applications. For example, an electrical connection may be present on the first electrically conductive layer 12 and another electrical connection to the second electrically conductive layer 20. The capacitor may be connected to or be incorporated into a printed circuit board or other electronic device or the electronic device may comprise a printed circuit board comprising the capacitor. They may be coupled with or embedded within rigid, flexible or in rigid/flexible electrical circuits, printed circuit boards or other microelectronic devices such as chip packages. Generally, they are used by creating a first circuit pattern on the conductive layers. In addition, it may be necessary to generate vias in the capacitor to electrically connect opposing circuit layers.

Once a capacitor has been formed, circuit patterns may also be created in either of the electrically conductive layers using known etching techniques. In etching, a layer of a photo-imageable resist, dry-film or liquid material is applied to the conductive layer. Using a negative photo pattern, which is overlaid on the resist, the photoresist is exposed to actinic radiation such as UV radiation creating a desired circuit pattern. The imaged capacitor is then exposed to film developing chemistry that selectively removes the unwanted unexposed portions. The capacitor with circuit image is then contacted with known chemical etchant baths to remove the exposed conductive layer, leaving the final desired conductive patterned capacitor. Also, each of the conductive layers may optionally be electrically connected by forming a hole through the entire capacitor and filling it with a conductive metal.

The following non-limiting example serves to illustrate the invention.

EXAMPLE 1

A roll of one ounce electrodeposited copper foil, 35 micron thickness, 0.64 meters in width is mounted on an unwinding roller of a coating machine. A sample of foil 0.64×0.1 m$^2$ is taken and measured using a micrometer (capable of measuring 0.05 micron) to establish the foil thickness. The foil is threaded through tensioning rollers and into an oven through idler rollers and onto rewind rollers. The foil is tensioned to 0.7 kg per centimeter. Temperatures of the air oven dryer are set at 90° C., 120° C., and 150° C. in three different zones and allowed to stabilize. A drive motor is engaged on the rewind roller and the line speed is set to 2 m/min. A liquid epoxy resin is adjusted to 30% solids, a viscosity of about 300 centipoises, with methyl-ethyl ketone in a stainless steel mixing vat.

The gap between coating die and foil is adjusted to produce a wet film on the foil, resulting in a coated foil having a 7μ thick dried polymer film. A constant flow, pump pressure and volume of resin is maintained in the coating die to produce a constant film coating thickness and free of voids caused by air bubbles.

The solvent is evaporated off and the resin is cured in an oven. Once the steady state temperature in the oven is achieved, a sample of flexible coated-foil is taken to check the coated film thickness. The film thickness is measured by subtracting the foil thickness from the total coated-foil thickness. Adjustments to the gap between coating die and foil, and epoxy resin flow to the die are corrected based on this measurement. The process is repeated until the desired film thickness is attained to produce the first and second thermosetting layers on first and second copper foil layers.

The composite flexible foil obtained from coating the first thermosetting layer onto the first conducting layer is taken for application of a polymerizable layer of a liquid aromatic polyamide resin adjusted to 11% solid, having a viscosity of about 15000 centipoises, with N-methyl pyrrolidone. A polymerizable layer of 10μ thickness is formed on the resin side of the composite flexible foil in the manner described above. Temperatures of the air oven dryer and other coating conditions are adjusted to get the desired dried central polymerizable layer. A capacitor is formed by laminating this coated-foil with a piece of the second thermosetting layer on second copper foil such that each of the first and second thermosetting polymer layers and the central polymerizable layer are positioned between the first and second electrically conductive layers. Lamination is done on a hydraulic press at 182° C. (360° F.) and 22.5 kg/cm$^2$ (320 psi) for 115 min. The press is under vacuum of 74 cm (29 inches) of mercury. The capacitor is cut to size and processed to impart a pattern in the copper. The resulting capacitor is visually inspected and then electrically tested for shorting at 500 volts. The resulting capacitor layers will have a capacitance of at least 150 pF/cm² and a dielectric breakdown voltage of at least 4000 volts/mil.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives, which have been discussed above, and all equivalents thereto.

What is claimed is:

1. A multilayered construction suitable for forming capacitors which comprises:
    a) a first electrically conductive layer, having first and second surfaces;
    b) a first thermosetting polymer layer, having first and second surfaces, on the first electrically conductive layer with the first surface of the first thermosetting polymer layer on the second surface of the first electrically conductive layer;
    c) a central polymerizable layer, having first and second surfaces, on the first thermosetting polymer layer with the first surface of the central polymerizable layer on the second surface of the first thermosetting polymer layer, which central polymerizable layer comprises a polymerizable precursor of a polyethylene terephthalate, a polyethylene naphthalate, a polyvinyl carbazole, a polyphenylene sulfide, an aromatic polyamide, a polyethernitrile, a polyether-ether-ketone, or combinations thereof;
    d) a second thermosetting polymer layer, having first and second surfaces, on the central polymerizable layer with the first surface of the second thermosetting polymer layer on the second surface of the second surface of the central polymerizable layer; and
    e) a second electrically conductive layer, having first and second surfaces, on the second thermosetting polymer layer with the first surface of the second electrically conductive layer on the second surface of the second thermosetting polymer layer;
    wherein each of said first thermosetting polymer layer, said second thermosetting polymer layer and said central polymerizable layer optionally further comprises a filler material.

2. The multilayered construction of claim 1 wherein at least one of said first thermosetting polymer layer, said second thermosetting polymer layer and said central polymerizable layer further comprises a filler material.

3. The multilayered construction of claim 1 wherein each of said first thermosetting polymer layer, said second thermosetting polymer layer and said central polymerizable layer further comprises a filler material.

4. The multilayered construction of claim 1 wherein one or both of the first thermosetting polymer layer and the second thermosetting polymer layer comprise a material selected from the group consisting of an epoxy, a melamine, polyesters, polyester containing copolymers, a urethane, alkyd, a bis-maleimide triazine, a polyimide, an ester, polyarylene ethers, fluorinated polyarylene ethers, benzocyclobutenes, liquid crystal polymers, an allyated polyphenylene ethers, amines and combinations thereof.

5. The multilayered construction of claim 1 wherein each of said first and second thermosetting polymer layers comprise an epoxy.

6. The multilayered construction of claim 1 wherein each of said first and second thermosetting polymer layers comprise an epoxy and a filler.

7. The multilayered construction of claim 1 wherein said central polymerizable layer comprises a polymerizable polyamide precursor.

8. The multilayered construction of claim 1 wherein each of the first electrically conductive layer and second electrically conductive layer comprises copper.

* * * * *